(12) United States Patent
Chaoui

(10) Patent No.: US 7,902,908 B2
(45) Date of Patent: Mar. 8, 2011

(54) METHOD OF FORMING A CHARGE PUMP CONTROLLER AND STRUCTURE THEREFOR

(75) Inventor: Hassan Chaoui, Toulouse (FR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 517 days.

(21) Appl. No.: 11/996,475

(22) PCT Filed: Apr. 30, 2007

(86) PCT No.: PCT/US2007/067790
§ 371 (c)(1),
(2), (4) Date: Jan. 22, 2008

(87) PCT Pub. No.: WO2008/133690
PCT Pub. Date: Nov. 6, 2008

(65) Prior Publication Data
US 2010/0141331 A1    Jun. 10, 2010

(51) Int. Cl.
*H02M 3/18* (2006.01)
(52) U.S. Cl. ......... 327/536; 327/111; 327/429; 323/282; 363/60
(58) Field of Classification Search ................ 327/111, 327/536, 537, 429; 363/59, 60; 323/282
See application file for complete search history.

(56) References Cited

U.S. PATENT DOCUMENTS

| 7,224,591 | B2 * | 5/2007 | Kaishita et al. | 363/60 |
| 7,804,698 | B2 * | 9/2010 | Gerber | 363/60 |
| 7,843,181 | B2 * | 11/2010 | Capilla et al. | 323/282 |
| 2008/0094041 | A1 * | 4/2008 | Gerber | 323/233 |
| 2008/0224627 | A1 * | 9/2008 | Genest | 315/224 |

* cited by examiner

*Primary Examiner* — Lincoln Donovan
*Assistant Examiner* — Patrick O'Neill
(74) *Attorney, Agent, or Firm* — Robert F. Hightower

(57) ABSTRACT

In one embodiment, a charge pump controller is configured with transistors having at least two different selectable on-resistance values may be used to charge a pump capacitor.

14 Claims, 5 Drawing Sheets

METHOD OF FORMING A CHARGE PUMP CONTROLLER AND STRUCTURE THEREFOR

BACKGROUND OF THE INVENTION

The present invention relates, in general, to electronics, and more particularly, to methods of forming semiconductor devices and structures.

In the past, the semiconductor industry utilized various methods and structures to build charge pump controllers that utilized capacitors to increase the value of a voltage from a voltage source in order to apply a large voltage to a load. Typically, transistors were used as switches that alternately coupled the pump capacitor to a voltage source for charging the pump capacitor and then coupled the pump capacitor in series with the voltage source to supply a higher voltage to the load. An example of a charge pump controller was disclosed in PCT patent publication No. WO/2007/008202 of inventor Remi Gerber that was published on Jan. 18, 2007.

When a switched capacitor controller first applied power to the pump capacitor, a large current was required to initially charge the capacitor to the desired voltage. This current was often referred to as an in-rush current. The in-rush current generally was very large and often exceeded the maximum current capacity of the voltage source used to charge the capacitor.

Also, if the output of the controller were shorted to ground, the short circuit condition often caused a large short-circuit current to flow which often damaged the controller.

Accordingly, it is desirable to have a switched capacitor controller that limits the value of the in-rush current and that minimizes damage under short-circuit conditions.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the device of the present invention will be illustrated to show either a cellular design (where the body regions of a transistor are a plurality of cellular regions) or a single body design (where the body region is comprised of a single region formed in an elongated pattern, typically in a serpentine pattern). The device of the present invention will be described as a single body design throughout the description for ease of understanding, however, it should be understood that it is intended that the present invention encompass both a cellular design and a single body design.

DETAILED DESCRIPTION OF THE DRAWINGS

Figure 1:
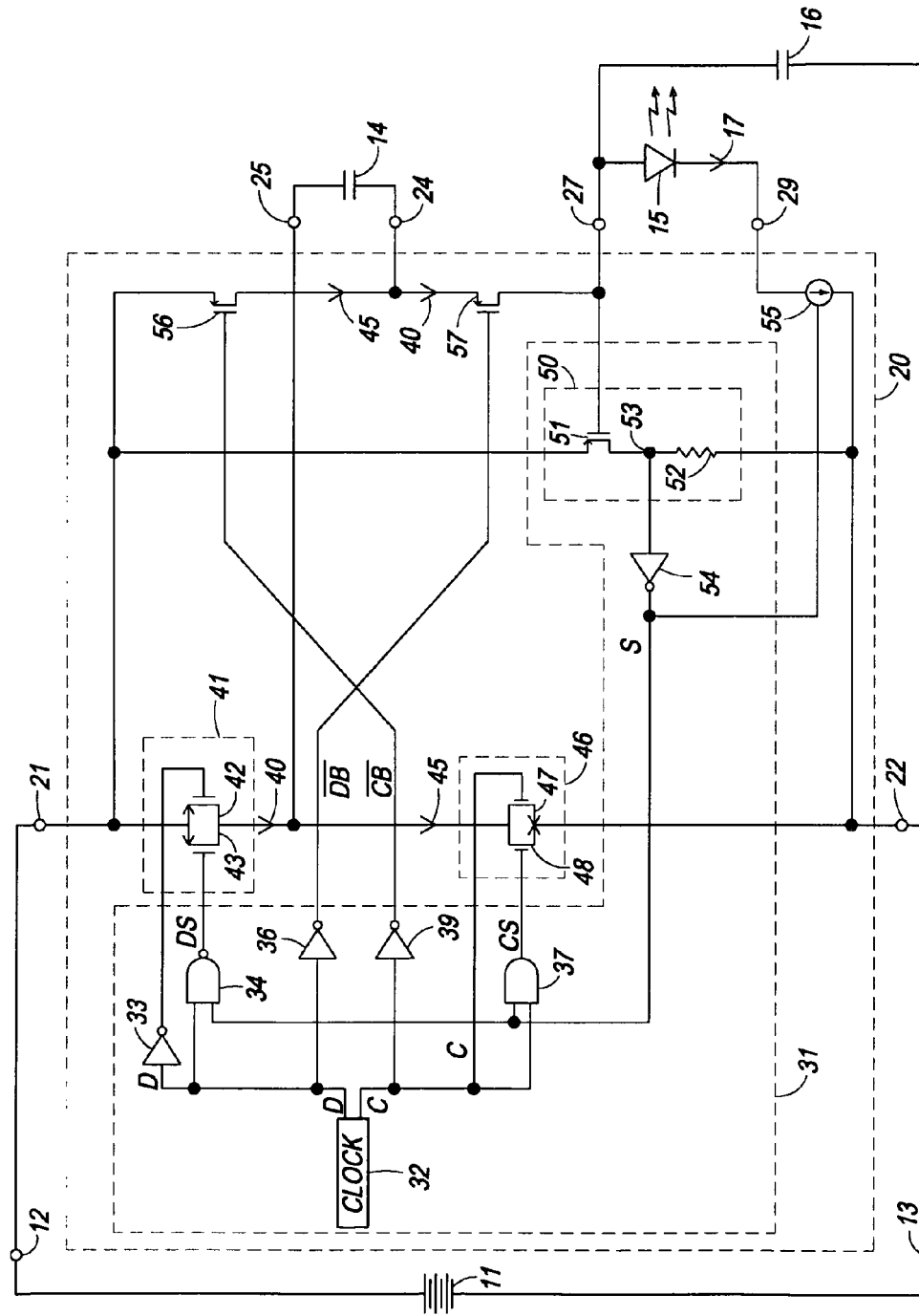
FIG. 1 schematically illustrates an embodiment of a portion of an exemplary form of a power supply system that utilizes a switched capacitor controller in accordance with the present invention.

FIG. 1 schematically illustrates an embodiment of a portion of an exemplary form of a power supply system 10 that utilizes a switched capacitor controller 20 to supply an output voltage to a load such as a light emitting diode (LED) 15. System 10 receives power from a voltage source, such as a battery 11, between a power input terminal 12 and a power return terminal 13 and forms the output voltage between an output 27 and return terminal 13. A pump capacitor 14 is utilized to increase the value of the voltage received from battery 11 in order to provide the output voltage and a load current 17 to LED 15. A capacitor 16 may be connected between output 27 and return 13 to stabilize the value of the output voltage provided to LED 15.

Switched capacitor controller 20 is configured to limit the value of a charging current 45 used to charge capacitor 14 during an initial start-up phase and to supply a larger value of current 45 to charge capacitor 14 after the start-up phase. As will be seen further hereinafter, controller 20 utilizes transistors with two different on-resistance values. A first on-resistance is selectively used during the start-up phase in order to limit the value of the current supplied to pump capacitor 14 and a lower on-resistance is selectively used after the start-up phase.

Controller 20 has a power input 21 and a power return 22 that are connected between terminals 12 and 13 in order to receive power for operating controller 20. Controller 20 includes pump capacitor inputs 24 and 25 for connecting capacitor 14 to controller 20, an output 27 that supplies the output voltage to the load, and a control input 29 that is used to control the value of load current 17. A switch matrix of controller 20 includes an MOS transistor 41, another MOS transistor 46, in addition to two switches such as transistors 56 and 57. The switch matrix is utilized to alternately connect capacitor 14 between a charging configuration that is utilized to charge capacitor 14 from the input voltage received from battery 11, and a discharge configuration in which capacitor 14 is utilized, along with battery 11, to supply a current 40 to LED 15 and to capacitor 16.

A control circuit 31 of controller 20 is utilized to formed clock signals and control signals that are utilized to operate the switch matrix. A current source 55 is utilized to control the value of current 17. Control circuit 31 includes a multiphase clock generator or clock 32, NAND gate 34, AND gate 37, a comparator 50, and inverters 33, 36, 39, and 54. Most of the elements of circuit 31 are connected between input 21 and return 22 in order to receive operating power. Comparator 50, along with an inverter 54, is used to form a start-up (S) signal that indicates controller 20 is operating in a start-up phase of operation and to indicate that the start-up phase of operation is completed. Clock 32 generates two non-overlapping clocks labeled as a charging clock (C) and a discharge clock (D). Gates 34 and 37 use the C and D signal in addition to the start-up (S) signal to form a respective control signals referred to as charging start-up (CS) and discharging start-up (DS). The CS and DS signals are used to selectively change the on-resistance of transistors 41 and 46. Inverters 36 and 39 form control signals CB bar and DB bar, respectively, that are used to assist in connecting capacitor 14 in the charging and discharging configurations, respectively.

Figure 2:
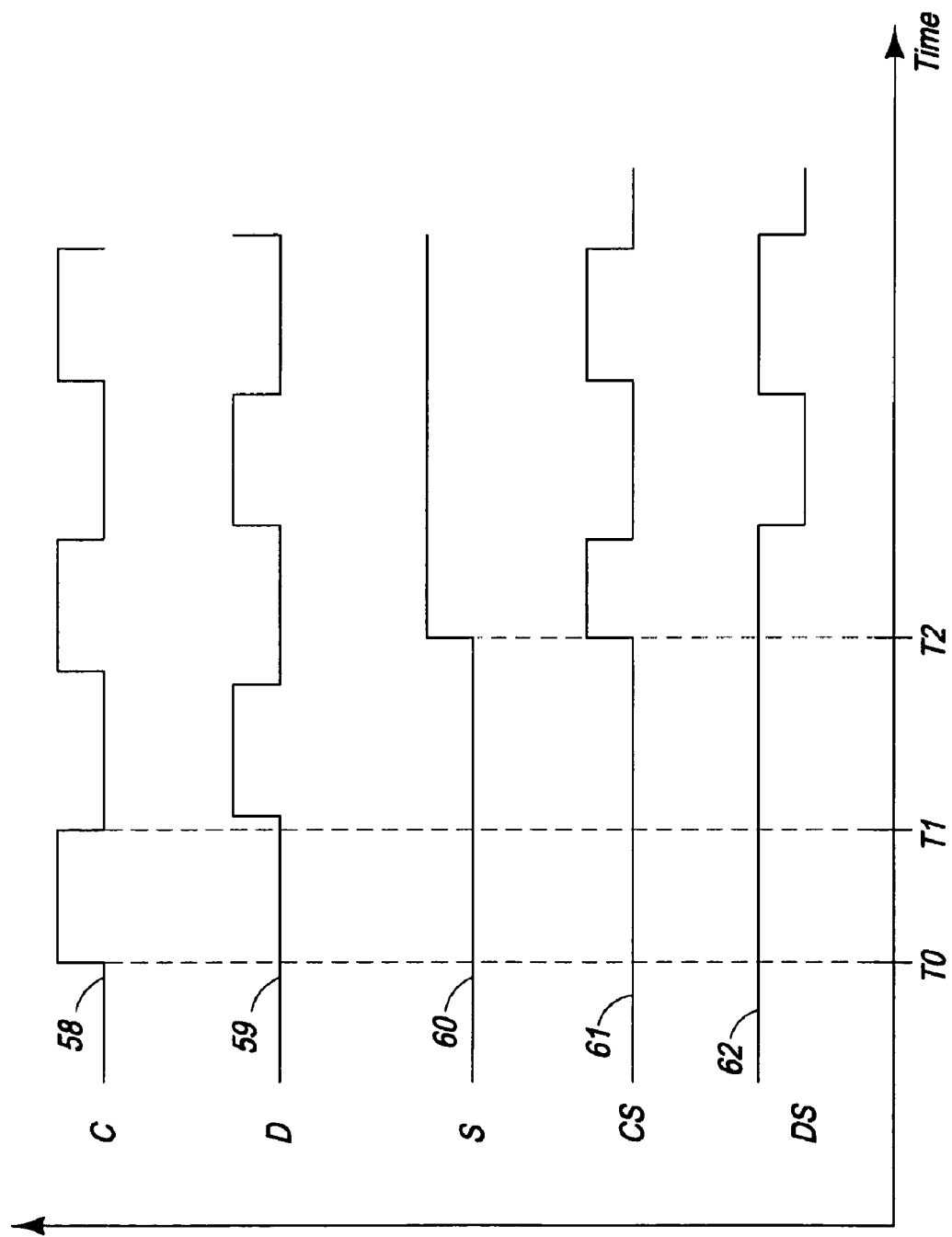
FIG. 2 is a graph having plots that illustrate some of the signals formed during the operation of the switched capacitor controller of FIG. 1 in accordance with the present invention.

FIG. 2 is a graph having plots that illustrate some of the signals formed during the operation of controller 20. The abscissa indicates time and the ordinate indicates increasing value of the illustrated signal. A plot 58 illustrates the charging clock (C) signal, a plot 59 illustrates the discharge clock (D) signal, a plot 60 illustrates the start-up (S) signal, a plot 61 illustrates the charging start-up (CS) signal, and a plot 62 illustrates a discharging start-up (DS) signal. This description has references to FIG. 1 and FIG. 2. When power is first applied, capacitors 14 and 16 are discharged. Comparator 50 compares the voltage on capacitor 16 to the value of the input voltage on input 21. If the value of the voltage on capacitor 16 is less than a reference voltage, comparator 50 and inverter 54 force the start-up (S) signal low to indicate that capacitors 16 and 14 are not charged and that controller 20 is operating in the start-up phase.

Figure 3:
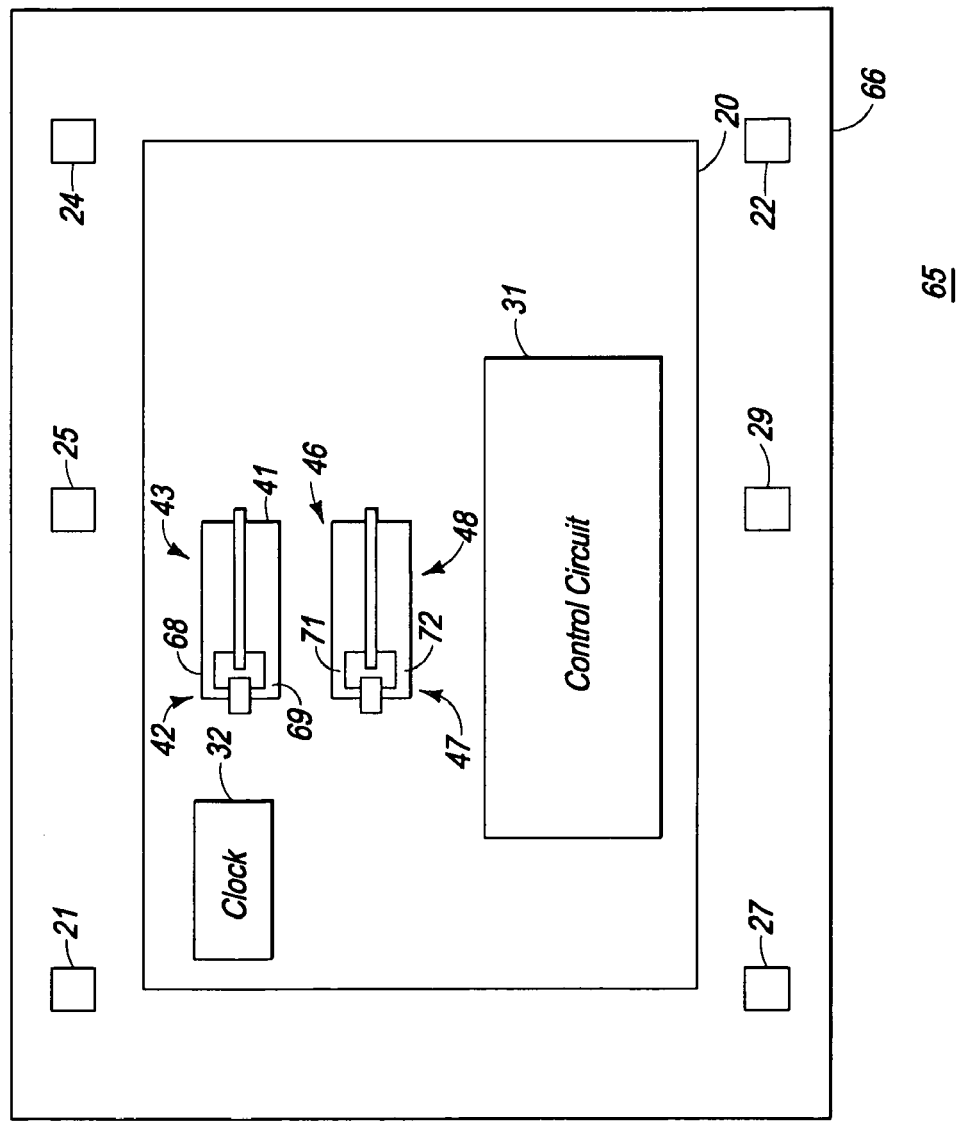
FIG. 3 schematically illustrates an enlarged plan view of a semiconductor device that includes the controller of FIG. 1 in accordance with the present invention.

Transistor 41 is formed to have two transistor portions 42 and 43 that each operate as individual transistors. Transistor portions 42 and 43 have a common source region and a common drain region but separate gates and channels regions so that transistor portions 42 and 43 may be enabled and disabled independently by applying separate signals to the separate gates. The first transistor portion 42 is formed to have a narrower channel width than the second transistor portion 43. Thus, when a signal is applied to the gate of portion 42 that disables portion 43 and enables portion 42, transistor 41 has a first on-resistant. When portion 43 is enabled and portion 42 is disabled transistor 41 has a second on-resistance that is lower that the first on-resistance because the width of the channel of portion 43 is wider than the width of the channel of portion 42. Since portions 42 and 43 are connected in parallel, applying signals to the gates of portions 42 and 43 that enables both portions 42 and 43 forms an on-resistant for transistor 41 that is lower than the on-resistance of either portion 42 or portion 43 alone. Transistor 46 typically is formed similarly to transistor 41 to have a first portion 47 and a second portion 48 that are formed similarly to respective portions 42 and 43. Transistors 41 and 46 may be formed as a single body region as illustrated in FIG. 3, or as cell based structures that have multiple body regions. Cell based transistor structures are well known to those skilled in the art.

Assume for purposes of understanding the operation of controller 20 that at a time T0 (FIG. 2) capacitors 14 and 16 had previously been discharged. Clock 32 forces the charging clock (C) signal high and ensures that the discharging clock (D) is low as illustrated by plots 58 and 59. Since capacitor 16 is discharged, capacitor 16 appears as a short circuit, thus, the gate of transistor 51 is pulled low through capacitor 16 thereby enabling transistor 51. With transistor 51 enabled, transistor 51 pulls node 53 to the value of power input 21, thus, node 53 is high and the start-up signal (S) on the output of inverter 54 is low. The low D signal forces the output of inverter 33 high to disable portion 42 of transistor 41. The low S signal forces the output of gate 34 high to disable portion 43 of transistor 41. The low D signal also forces the output of inverter 36 high to disable transistor 57. The low start-up (S) signal forces the output of gate 37 low and blocks the high C signal from enabling portion 48 of transistor 46. However, the high C signal enables portion 47 of transistor 46 which couples the terminal of capacitor 14 that is connected to input 25 to return 22. The high C signal also forces the output of inverter 39 low which enables transistor 56 to couple the other terminal of capacitor 14 from input 24 to receive the voltage from input 21 and to receive charging current 45 thereby charging capacitor 14. Since only portion 47 of transistor 46 is enabled, the on-resistance of transistor 46 is high thereby limiting the value of charging current 45. Preferably, the on-resistance of transistor 46 that is formed by portion 47 is selected to ensure that the value of current 45 during the start-up phase is less than the maximum value of current that can be supplied by battery 11.

Subsequently at a time T1 (FIG. 2), the C signal goes low and thereafter the D signal goes high. The low C signal disables transistors 46 and 56 to decouple capacitor 14 from receiving charging current 45 and the voltage from battery 11. Since S remains low, gate 34 blocks the high D signal from affecting portion 43 of transistor 41. However, the high D signal forces the output of inverter 33 low to enable portion 42 of transistor 41 thereby enabling transistor 41 at a high on-resistance to couple the first terminal of capacitor 14 from input 25 in series with the voltage from battery 11 received on input 21. The high D signal also forces the output of inverter 36 low thereby enabling transistor 57 to couple the second terminal of capacitor 14 to output 27 in order to supply current 40 to the load of LED 15 and to charge capacitor 16. Because only portion 42 of transistor 41 is enabled, the on-resistance of transistor 41 is high and the value of current 40 is low. The on-resistance of portion 42 usually is selected to ensure that current 40 is less than the maximum value of current that can be supplied by battery 11. Additionally, since the S signal is low, current source 55 is disabled which prevents current 40 from flowing through current source 55 to return 22, thus, capacitor 14 is used to charge capacitor 16. Clock 32 continues forming the charging clock (C) signal and the discharging clock (D) signal. As long as the start-up (S) signal remains low, controller 20 continues to utilize only the first portion of transistors 41 and 46 to charge capacitor 14 thereby limiting the value of charging current 45 and discharging current 40.

Subsequently at time T2, capacitor 16 becomes charged to a value that is greater than the reference voltage applied to comparator 50 which forces the S signal high. In the preferred embodiment of comparator 50, the start-up phase of operation is completed when the voltage on capacitor 16 is charged to a value that is no less than the voltage from battery 11 minus the threshold voltage (Vth) of transistor 51 thereby disabling transistor 51. In other embodiments, comparator 50 may have other embodiments including a differential comparator with a separate reference voltage. The high S signal on the output of inverter 54 enables gates 37 and 34 so that the C signal and D signals, respectively, are utilized to enable both portions 47 and 48 of transistor 46 and portions 42 and 43 of transistor 41 thereby forming a lower on-resistance for transistors 46 and 41. The multiple on-resistances allows forming current 45 to have a low value during the start-up phase and a higher current value after the start-up phase is complete. The higher value of current 45 stores a larger charge on capacitor 14 so that current 40 can keep capacitor 16 charged in addition to supplying load current 17, as controlled by source 55, to LED 15. This allows capacitor 16 to supply current 17, as controlled by source 55, during the time intervals that capacitor 14 is connected in the charging configuration. Preferably, the on-resistance formed by first portion 47 is at least ten (10) times greater than the on-resistance formed by second portion 48 of transistor 46. Similarly, the on-resistance formed by first portion 42 is generally at least ten (10) times greater than the on-resistance form by second portion 43 of transistor 41. Typically, transistors 56 and 57 have an on-resistance that is in the same order of magnitude as the lower on-resistance formed by both portions of transistors 41 and 46.

During the operation of controller 20, if output 27 were shorted to return terminal 13, the output voltage on output 27 would become less than the voltage on input 21 minus the reference voltage of comparator 50, thus, the S signal again would go low thereby disabling second portions 43 and 48 of transistors 41 and 46, respectively. Controller 20 would continue to operate and use first portion 47 transistor 46 to charge capacitor 14 and first portion 42 of transistor 41 to discharge capacitor 14. Because of the high on-resistance of portions 42 and 47 the current supplied through output 27 would be limited which would prevent the short circuit condition on output 27 from destroying controller 20.

In order to facilitate this operation of controller 20, the output of clock 32 that generates the C signal is commonly connected to an input of inverter 39, the gate of first portion 47 of transistor 46, and a first input of gate 37. A second input of gate 37 is commonly connected to a first input of gate 34, the control input of source 55, and an output of inverter 54. An input of inverter 54 is connected to node 53. An output of gate 37 is commonly connected to the gate of portion 48 of transistor 46. The output of inverter 39 is connected to the gate of transistor 56. The output of clock 32 that forms the D signal is connected to the input of inverter 36, a second input of gate 34, and an input of inverter 33. An output of inverter 33 is connected to the gate of portion 42 of transistor 41. The output of gate 34 is commonly connected to the gate of portion 43 of transistor 41. The output of inverter 36 is connected to the gate of transistor 57. The source of portions 43 and 42, thus the source of transistor 41, is connected to input 21. The drain of portions 43 and 42, thus the drain of transistor 41, is connected to input 25. The drain of portions 47 and 48, thus the drain of transistor 46, is connected to input 25. The source of portions 47 and 48, thus the source of transistor 46, is connected to return 22. The source of transistor 51 is commonly connected to input 21 and the source of transistor 56. A drain of transistor 51 is connected to node 53 and a first terminal of resistor 52. A gate of transistor 51 is connected to output 27. A second terminal of resistor 52 is commonly connected to return 22 and a return of current source 55. An input of current source 55 is connected to input 29. A drain of transistor 57 is connected to output 27. A source of transistor to 57 is commonly connected to input 24 and a drain of transistor 56. A first terminal of capacitor 14 is connected to input 25 and a second terminal is connected to input 24.

FIG. 3 schematically illustrates an enlarged plan view of a portion of an embodiment of a semiconductor device or integrated circuit 65 that is formed on a semiconductor die 66. Controller 20 is formed on die 66. Die 66 may also include other circuits that are not shown in FIG. 3 for simplicity of the drawing. Controller 20 and device or integrated circuit 65 are formed on die 66 by semiconductor manufacturing techniques that are well known to those skilled in the art. The plan view illustrates that transistor portions 42 and 43 have a common source region 68 and a separate common drain region 69. Also, transistor portions 47 and 48 have a common source region 71 and a separate common drain region 72.

Figure 4:
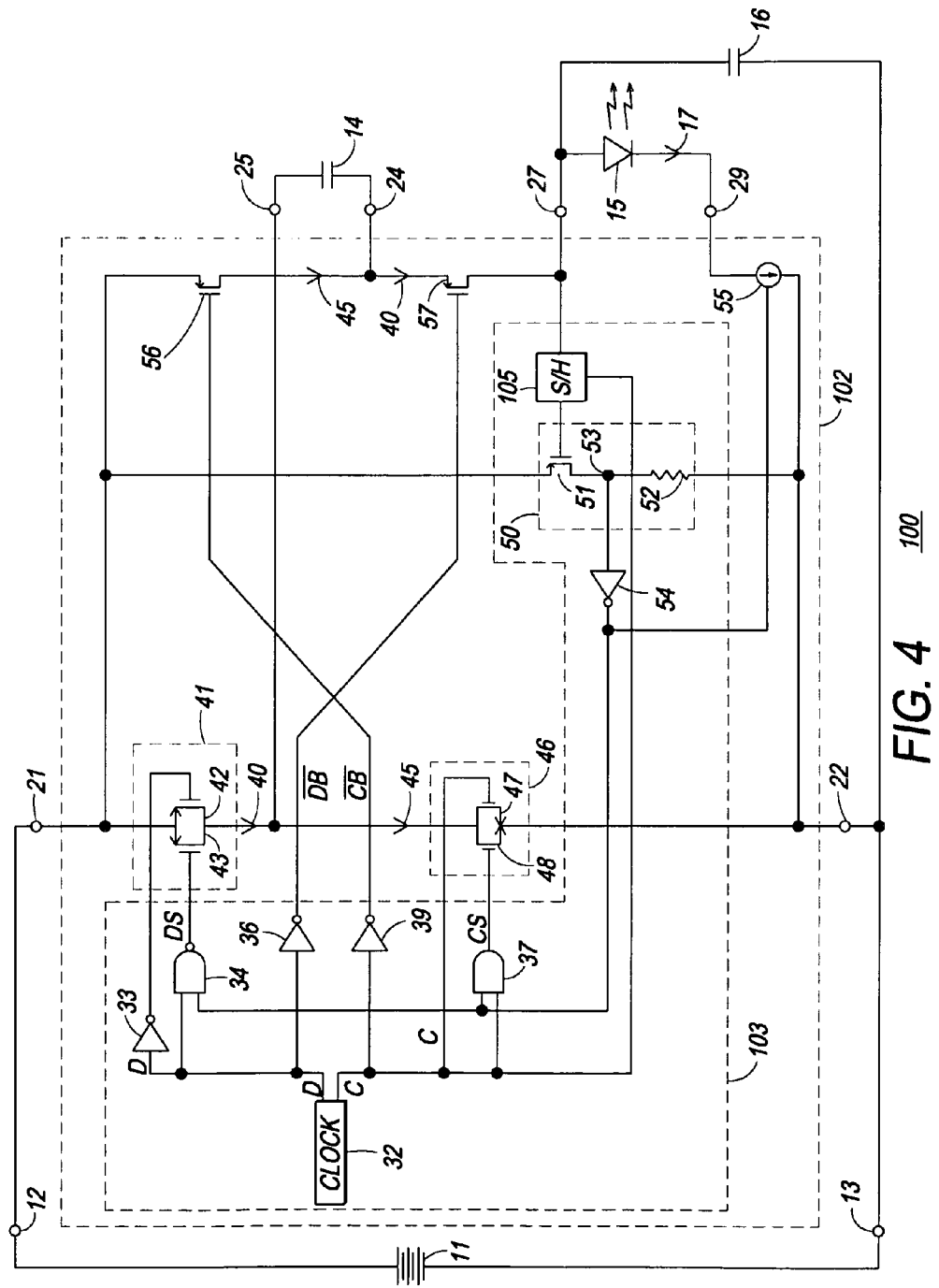
FIG. 4 schematically illustrates an embodiment of a portion of an exemplary form of another switched capacitor controller that is an alternate embodiment of the controller of FIG. 1 in accordance with the present invention.

FIG. 4 schematically illustrates an embodiment of a portion of an exemplary form of a power supply system 100 that is an alternate embodiment of system 10 that was described in the description of FIG. 1. System 100 includes a switched capacitor controller 102 that is an alternate embodiment of controller 20 that was described in the description of FIG. 1. Controller 102 includes a control circuit 103 that is an alternate embodiment of control circuit 31 that was described in the description of FIG. 1 except that circuit 103 utilizes the voltage stored on pump capacitor 14 to determine the appropriate time at which the start-up phase is complete. Controller 103 compares the voltage stored on capacitor 14 to a reference voltage instead of comparing the voltage on load capacitor 16 to the reference voltage. Circuit 103 includes a sample-and-hold (S/H) circuit 105 that samples the voltage on capacitor 14 when the C signal is high. Sample-and-hold (S/H) circuit 105 forms a signal that is representative of the value of the voltage that is stored on capacitor 14.

Figure 5:
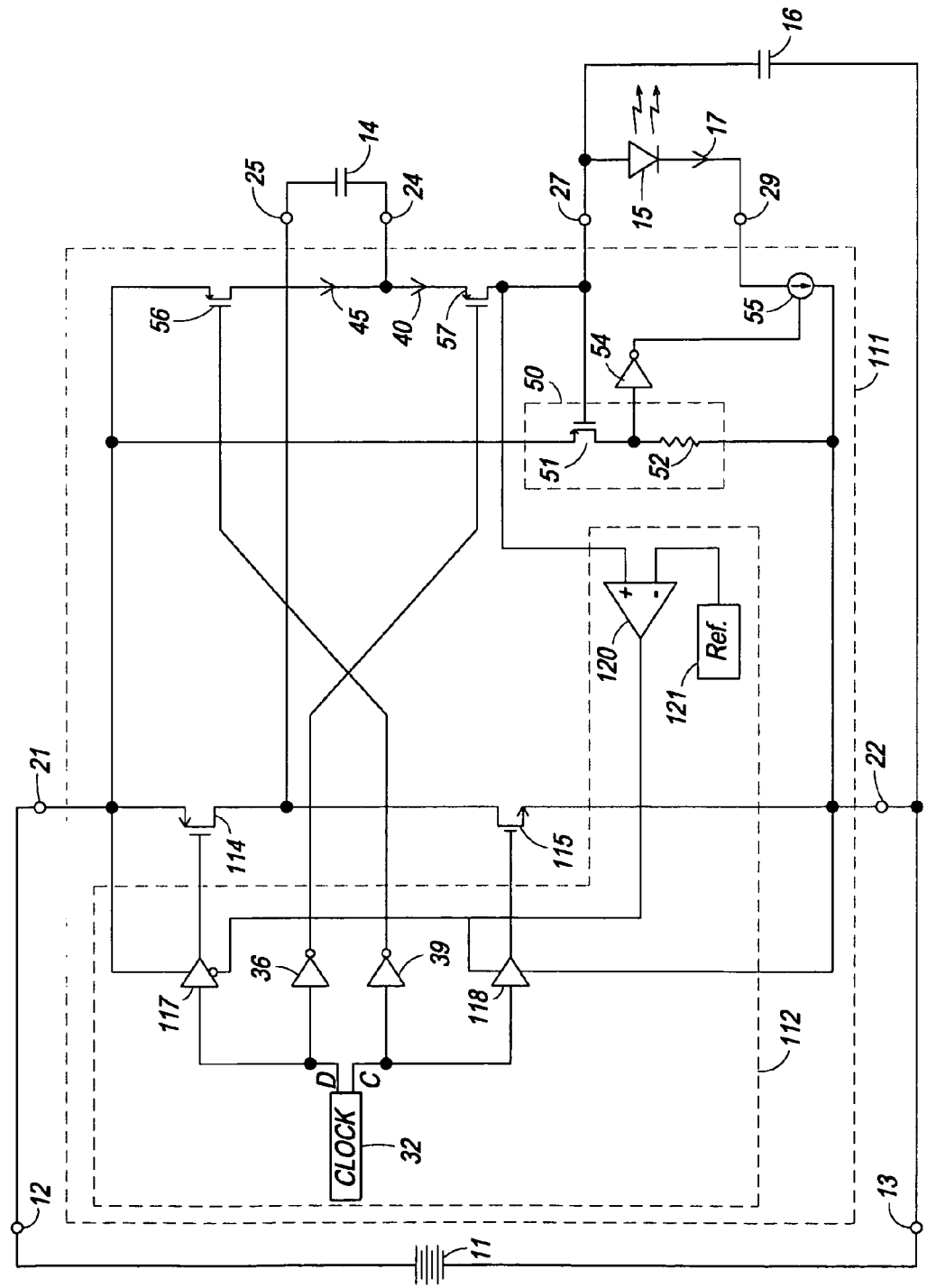
FIG. 5 schematically illustrates an embodiment of a portion of an exemplary form of another power supply system that utilizes another switched capacitor controller in accordance with the present invention.

FIG. 5 schematically illustrates an embodiment of a portion of an exemplary form of a power supply system 110 that is an alternate embodiment of system 10 that was described in the description of FIG. 1. System 110 includes a switched capacitor controller 111 that is an alternate embodiment of controller 20 that was described in the description of FIG. 1. Controller 111 includes a control circuit 112 that is an alternate embodiment of control circuit 31 that was described in the description of FIG. 1 except that circuit 112 is operably coupled to enable transistors 114 and 115 at a high on-resistance value and progressively decrease the on-resistance as the voltage on capacitor 16 increases. Controller 112 is configured to enable transistors 114 and 115 with a gate-to-source voltage (Vgs) value that causes transistors 114 and 115 to have the high on-resistance value, and then progressively increases the Vgs to decrease the on-resistance. A buffer 117 is connected to receive operating voltage between input 21 and the output of an analog adder 120. The value of the output signal formed on the output of buffer 117 swings between the value of the voltage on input 21 and the value of the voltage on input 21 minus the value of the output voltage formed by adder 120. A buffer 118 is connected to receive operating voltage between an output of adder 120 and return 22. As the value of the voltage on capacitor 16 increases, the output of adder 120 increases which results in increasing the Vgs applied to transistors 114 and 115. Transistor 115 can be viewed as a variable resistor or variable current source that controls the value of charging current 45. Similarly, transistor 114 can be viewed as a variable resistor or variable current source that controls the value of discharge current 40.

In view of all of the above, it is evident that a novel device and method is disclosed. Included, among other features, is forming switch transistors to have multiple gates that result in allows enabling different numbers of the multiple gates to selectively form multiple on-resistances for the transistors. Using the transistors to selective form a first on-resistance to charge a pump capacitor of a switched capacitor controller to a first voltage value and to also selectively use a lower on-resistance to maintain the voltage on the pump capacitor. Selectively using the different on-resistance values for different operating phases facilitates reducing the in-rush current at least during the start-up phase of operation. Using multiple on-resistances also improves the lifetime of a battery used to supply power to the pump capacitor, and reduces the cost of the switched capacitor controller.

While the subject matter of the invention is described with specific preferred embodiments, it is evident that many alternatives and variations will be apparent to those skilled in the semiconductor arts. More specifically the subject matter of the invention has been described for MOS transistors that have multiple gates and channel regions that facilitate selectively enabling the MOS transistors with different on-resistance values. Although the MOS transistors have been illustrated with two different gates and channel regions, any number of gate and channel regions may be used. Additionally, the multiple gate and channel regions may be selectively enabled using a variety of algorithms such as enabling them in a progressive manner to change the on-resistance in multiple steps over a time interval instead of using two different on-resistances. Further, single gate transistors may be progressively enabled to vary the on-resistance by progressively varying the Vgs of the transistors. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A switched capacitor controller comprising:
   a first MOS transistor having a first portion that includes a first gate and having a second portion that includes a second gate, the first gate configured to form a first on-resistance of the first MOS transistor, the second gate configured to form a second on-resistance for the first MOS transistor that is less than the first on-resistance, the first MOS transistor configured to couple a pump capacitor to receive a first current to charge the pump capacitor;
   a second MOS transistor having a first portion that includes a first gate and a having a second portion that includes a second gate, the first gate configured to form a first on-resistance of the second MOS transistor, the second gate configured to form a second on-resistance for the second MOS transistor that is less than the first on-resistance, the second MOS transistor configured to couple the pump capacitor to provide a second current to a load;
   a first circuit configured to enable the first portion of the first MOS transistor but not the second portion of the first MOS transistor to charge the pump capacitor responsively to a first voltage on one of the pump capacitor or a load capacitor being no greater than a first value;
   the first circuit configured to enable the first portion of the second MOS transistor but not the second portion of the second MOS transistor to provide the second current to the load responsively to the first voltage being no greater than the first value;
   the first circuit configured to enable the first and second portions of the first MOS transistor responsively to the first voltage being no less than the first value; and
   the first circuit configured to enable the first and second portions of the second MOS transistor responsively to the first voltage being no less than the first value.

2. The switched capacitor controller of claim 1 wherein the first circuit includes a comparator configured to compare the voltage on one of the pump capacitor or the load capacitor to a reference voltage.

3. The switched capacitor controller of claim 1 wherein the first circuit is configured to enable the first MOS transistor and the second MOS transistor out of phase with each other.

4. The switched capacitor controller of claim 1 further including a third transistor that is enabled responsively to enabling the first MOS transistor, the third transistor configured to couple one terminal of the pump capacitor to a charging voltage and the first MOS transistor configured to couple a second terminal of the pump capacitor to a voltage return.

5. The switched capacitor controller of claim 1 further including a fourth transistor that is enabled responsively to enabling the second MOS transistor, the fourth transistor configured to couple one terminal of the pump capacitor to an output of the switched capacitor controller and the second MOS transistor configured to couple a second terminal of the pump capacitor to receive an input voltage of the switched capacitor controller.

6. The switched capacitor controller of claim 1 wherein the first on-resistance of the first MOS transistor is greater than approximately ten times the second on-resistance of the first MOS transistor.

7. The switched capacitor controller of claim 1 wherein the first on-resistance of the second MOS transistor is greater than approximately ten times the second on-resistance of the second MOS transistor.

8. The switched capacitor controller of claim 1 wherein the first portion and the second portion of the first MOS transistor share common source and common drain regions and separate gate and channel regions.

9. The switched capacitor controller of claim 1 wherein the first MOS transistor formed as a cell based transistor.

10. A method of forming a switch for a switched capacitor controller comprising:
    forming a first MOS transistor with a first portion having a first gate that provides the first MOS transistor a first on-resistance responsively to enabling the first portion and with a second portion having a second gate that provides the first MOS transistor a second on-resistance responsively to enabling the second portion; and
    coupling the first MOS transistor to operably switch a pump capacitor to receive a first current to charge the pump capacitor.

11. The method of claim 10 further including configuring a control circuit to enable the first portion of the first MOS transistor and not enable the second portion of the first MOS transistor responsively to a voltage on one of the pump capacitor or on a load capacitor being no greater than a first value.

12. The method of claim 10 further including forming a second MOS transistor with a first portion having a first gate that provides the second MOS transistor a first on-resistance responsively to enabling the first portion and with a second portion having a second gate that provides the second MOS transistor a second on-resistance responsively to enabling the second portion; and
    coupling the second MOS transistor to operably switch the pump capacitor to provide a second current from the pump capacitor to a load.

13. The method of claim 12 further including configuring a control circuit to enable the first portion of the first MOS transistor and the first portion of the second MOS transistor but not enable the second portion of the first MOS transistor and not enable the second portion of the second MOS transistor responsively to a voltage on one of the pump capacitor or a load capacitor being no greater than a first value.

14. The method of claim 10 wherein forming the first MOS transistor with the first portion includes forming the first portion and the second portion to have a common source region and a common drain region but separate channel and gate regions and further including forming the first on-resistance to be at least ten times the second on-resistance.

* * * * *